(12) United States Patent
Chen et al.

(10) Patent No.: US 8,059,335 B2
(45) Date of Patent: Nov. 15, 2011

(54) ADJUSTABLE OPTICAL SIGNAL DELAY MODULE AND METHOD THEREOF

(75) Inventors: Jye hong Chen, Jhubei (TW); Wei-Che Kao, Changhua (TW); Peng-Chun Peng, Jhonghe (TW); Chun-Ting Lin, Taichung (TW); Fang Ming Wu, Yanshuel Township, Tainan County (TW); Po Tsung Shih, Tainan (TW); Sien Chi, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 301 days.

(21) Appl. No.: 12/314,720

(22) Filed: Dec. 16, 2008

(65) Prior Publication Data

US 2010/0073763 A1    Mar. 25, 2010

(30) Foreign Application Priority Data

Sep. 19, 2008 (TW) .............................. 97135968 A

(51) Int. Cl.
 *H01S 4/00* (2006.01)
 *H04B 10/12* (2006.01)
(52) U.S. Cl. ........................................ 359/344; 359/349
(58) Field of Classification Search .................. 359/344, 359/341.4, 349
 See application file for complete search history.

(56) References Cited

U.S. PATENT DOCUMENTS

| | | | |
|---|---|---|---|
| 6,356,377 B1 | 3/2002 | Bishop et al. | |
| 6,563,631 B2* | 5/2003 | Delprat et al. | 359/344 |
| 6,751,013 B1* | 6/2004 | Wu | 359/337 |
| 6,950,232 B1* | 9/2005 | Yam | 359/341.5 |
| RE38,809 E | 10/2005 | Yao | |
| 7,113,329 B2* | 9/2006 | DiJaili et al. | 359/344 |
| 7,212,695 B2 | 5/2007 | Kasper et | |
| 7,251,395 B2 | 7/2007 | Upton | |
| 7,385,753 B2* | 6/2008 | Chung et al. | 359/334 |
| 2003/0035204 A1* | 2/2003 | Ahn et al. | 359/341.3 |
| 2004/0218259 A1* | 11/2004 | Hui et al. | 359/344 |
| 2004/0246567 A1* | 12/2004 | Ahn et al. | 359/337 |
| 2005/0063044 A1* | 3/2005 | Michie et al. | 359/344 |
| 2005/0271384 A1* | 12/2005 | Lee et al. | 398/13 |
| 2006/0050368 A1* | 3/2006 | Chung et al. | 359/344 |

OTHER PUBLICATIONS

Arshad Chowdhury, Yong-Kee Yeo, Jianjun Yu, Gee-Kung Chang; DWDM Reconfigurable Optical Delay Buffer for Optical Packet Switched Networks, IEEE Photonics Technology Letters, vol. 18, No. 10, May 15, 2006.

(Continued)

*Primary Examiner* — Eric Bolda
(74) *Attorney, Agent, or Firm* — Rosenberg, Klein & Lee

(57) ABSTRACT

An adjustable optical signal delay module which adjusts power of an amplified spontaneous emission generated by a semiconductor optical amplifier and feeds the adjusted amplified spontaneous emission back to the semiconductor optical amplifier in a direction opposite to an optical signal being amplified by the semiconductor optical amplifier is provided. The feedback of the adjusted amplified spontaneous emission varies a group refractive index of the semiconductor optical amplifier and delays the transmission of an optical signal through the semiconductor optical amplifier. By that arrangement, the adjustable optical delay module obviates the need for the pump laser conventionally required by a coherent population oscillation mechanism. The feedback optical loop includes a variable optical attenuator, an optical filter, and optical circulators. A user can control the delay timing of optical signals via adjusting optical power in the feedback optical loop.

4 Claims, 5 Drawing Sheets

OTHER PUBLICATIONS

D. Janner, G. Galzerano, G. Della Valle, P. Laporta, and S. Longhi; Slow Light in Periodic Superstructure Bragg Gratings, Physical Review, The American Physical Society, E72, 056605 (2005).

Yurii A. Vlasov, Martin O'Boyle, Hendrik F. Harmann & Sharee J. McNab; Active Control of Slow Light on a Chip with Photonic Crystal Waveguides, Nature, vol. 438, Nov. 3, 2005.

* cited by examiner

ADJUSTABLE OPTICAL SIGNAL DELAY MODULE AND METHOD THEREOF

BACKGROUND OF THE INVENTION

1. Field of the Invention

The present invention relates to an optical signal delay module and a method thereof, particularly to a module and method, which reversely feedbacks an amplified spontaneous emission generated by an optical amplifier to the optical amplifier through a loop to modify the group refractive index of the amplifier. By varying the group refractive index of the optical amplifier, the transmission of optical signals can be delayed.

2. Description of the Related Art

Fiber-optic communication is a communication method based on light and optical fibers. Light can be used to carry information after being modulated where it features a superior transmission capacity and a high information security. Since 1980s, the fiber-optic communication system plays a very important role in the digital world. In principle, the outgoing information is transferred from the sender side to the transmitter, and the signal modulates the carrier wave, which functions as the transmission medium of information, and then the modulated carrier wave is sent to the recipient side in a distant place, and the receiver demodulates the modulated carrier wave to obtain the original information.

A single optical fiber can simultaneously transfer several groups of signals having different wavelengths, such as the signals of telephone, the Internet, and cable TV. Optical fiber outperforms copper wire in signal impairment and signal interference, and the advantages are especially obvious in long-distance massive data transmission. After different-wavelength optical signals are coupled and sent into the incident side, the different-wavelength optical signals will have different phase delays inside the waveguide because different-path signals have different timings. Thus, the data traffic may exceed the processing capability of the recipient side. Therefore, the optical fiber network needs technologies to delay optical signals and guarantee that data traffic is within the processing capability of the recipient side to prevent data loss. The current optical signal delay technologies are usually based on controlling optical signal paths. However, such a design has to reserve extra optical signal paths in the optical network topology, it also requires a plurality of optoelectronic switches or mechanical switches and a complex control system, which consumes a lot of space and higher installation cost. Please refer to FIG. 1 for a proposed experimental setup by H. Su, and S. L. Chuang in Applied Physics Letters, Vol. 88, Art. No. 061102, 2006: an external pump laser is counterclockwise injected into a semiconductor optical amplifier (SOA) via an optical circulator, and the delay of optical signals can be controlled by varying the power of the pump laser. However, such a technology needs an external high-power and high-stability pump laser which is high in cost.

To overcome the abovementioned problem, the present invention proposes an optical signal delay module, which adjusts power of amplified spontaneous emission generated by a semiconductor optical amplifier (SOA) and reversely feeds the adjusted ASE back to the SOA. Thereby, the present invention can vary the group refractive index of the optical amplifier to achieve optical signal delay. Thus, the present invention, can replace the conventional pump laser required by a coherent population oscillation mechanism which greatly reduce the cost of establishing an optical network.

SUMMARY OF THE INVENTION

The primary objective of the present invention is to provide an adjustable optical signal time delays module and a method thereof, which uses Amplified Spontaneous Emission (ASE) generated by a semiconductor optical amplifier (SOA) to achieve the Coherent Population Oscillation (CPO) effect and vary the group refractive index of the SOA to delay the time of optical signals, whereby the present invention can replace the conventional technology of using an external pump laser to achieve the CPO effect or controlling optical paths to delay optical signals, and whereby the cost of an optical network is greatly reduced.

The adjustable optical signal delay module of the present invention mainly comprises a semiconductor optical amplifier (SOA) and a feedback optical loop. The SOA receives and amplifies an input optical signal and generates an ASE. The feedback optical loop is coupled to two ends (input and output) of the SOA and it is capable of adjusting the power of ASE and feeds the adjusted ASE back to the SOA to delay the timing of the optical signals by vary the group refractive index of the SOA. The feedback optical loop includes a front-stage 3-port optical circulator, a rear-stage 3-port optical circulator, an optical filter and an variable optical attenuator. The front-stage 3-port optical circulator receives an optical signal input at a first port thereof and outputs the optical signal to the SOA at a second port thereof. The second port of the front-stage 3-port optical circulator also receives ASE generated by the SOA and outputs ASE at a third port thereof. The rear-stage 3-port optical circulator receives the amplified optical signal at a second port thereof and outputs the amplified optical signal at a third port thereof. The optical filter receives ASE output by the third port of the front-stage 3-port optical circulator and filters out unnecessary waves. The variable optical attenuator adjusts ASE power and outputs the filtered and adjusted ASE to a first port of the rear-stage 3-port optical circulator. A second port of the rear-stage 3-port optical circulator feeds the filtered and adjusted ASE back to the SOA to vary the group refractive index of the SOA and delay the optical signals.

Below, the embodiments are described in detail in cooperation with the attached drawings to make easily understood the objectives, technical contents, characteristics and accomplishments of the present invention.

DETAILED DESCRIPTION OF THE INVENTION

The present invention discloses an adjustable optical signal delay module and a method thereof, particularly a module, wherein an user can effectively control the delay of optical signals by controlling the feedback power of Amplified Spontaneous Emission (ASE) generated by a semiconductor optical amplifier, whereby the fabrication cost of an adjustable optical signal delay module is reduced.

In 1917, Einstein proposed that the reaction of matter and radiation includes three basic processes: stimulated absorption, spontaneous emission, and stimulated emission. Stimulated absorption is a common absorption process. When photons having energy of hμ=E2−E1 impact a matter existing at a lower energy level E1 (the ground state) and having a higher energy level E2, the energy of photons makes the electrons of the matter jump from E1 to E2. After electrons have jumped to the excited state, the electrons will return the ground state by one of the two processes—spontaneous emission and stimulated emission. In spontaneous emission, electrons will spontaneous fall from the excited state to the ground state and emit photons of energy ht after a period of time without any external interference, wherein the direction and phase of the spontaneous emission is arbitrary. In stimulated emission, external photons impact electrons at the excited state, and the electrons fall from the excited state to the ground state; in this case, the generated photons have the same characteristics as the external photons, and the frequencies, phases, polarization directions and propagation directions of them are identical. In other words, spontaneous emission is a phenomenon that a matter containing excited electrons releases all or a portion of excess energy. Spontaneous emission is also a random process. Therefore, different excited molecules emit photons at different time points and in different ways to generate incoherent monochromatic radiation.

The adjustable optical signal delay module and the method thereof are realized by the Coherent Population Oscillation (CPO) effect induced by ASE of a SOA. In the present invention, a feedback optical loop is coupled to two ends of a SOA, and ASE generated by the SOA is fed back to the SOA via the feedback optical loop counterclockwisely. An user can vary the group refractive index of the SOA by adjusting the power of ASE. Thus, the present invention can delay optical signals via controlling the power of the feedback light.

Figure 1:
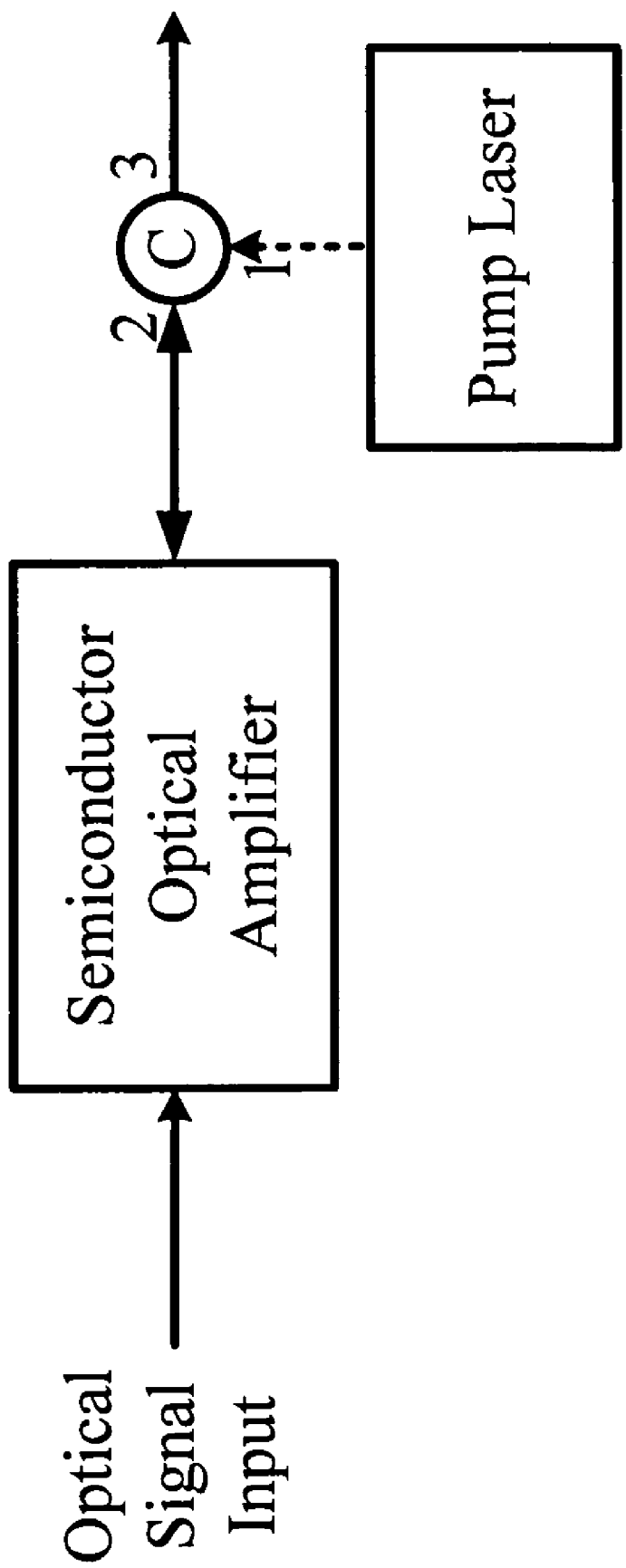
FIG. 1 is a diagram schematically showing the architecture of a conventional technology.
Figure 2:
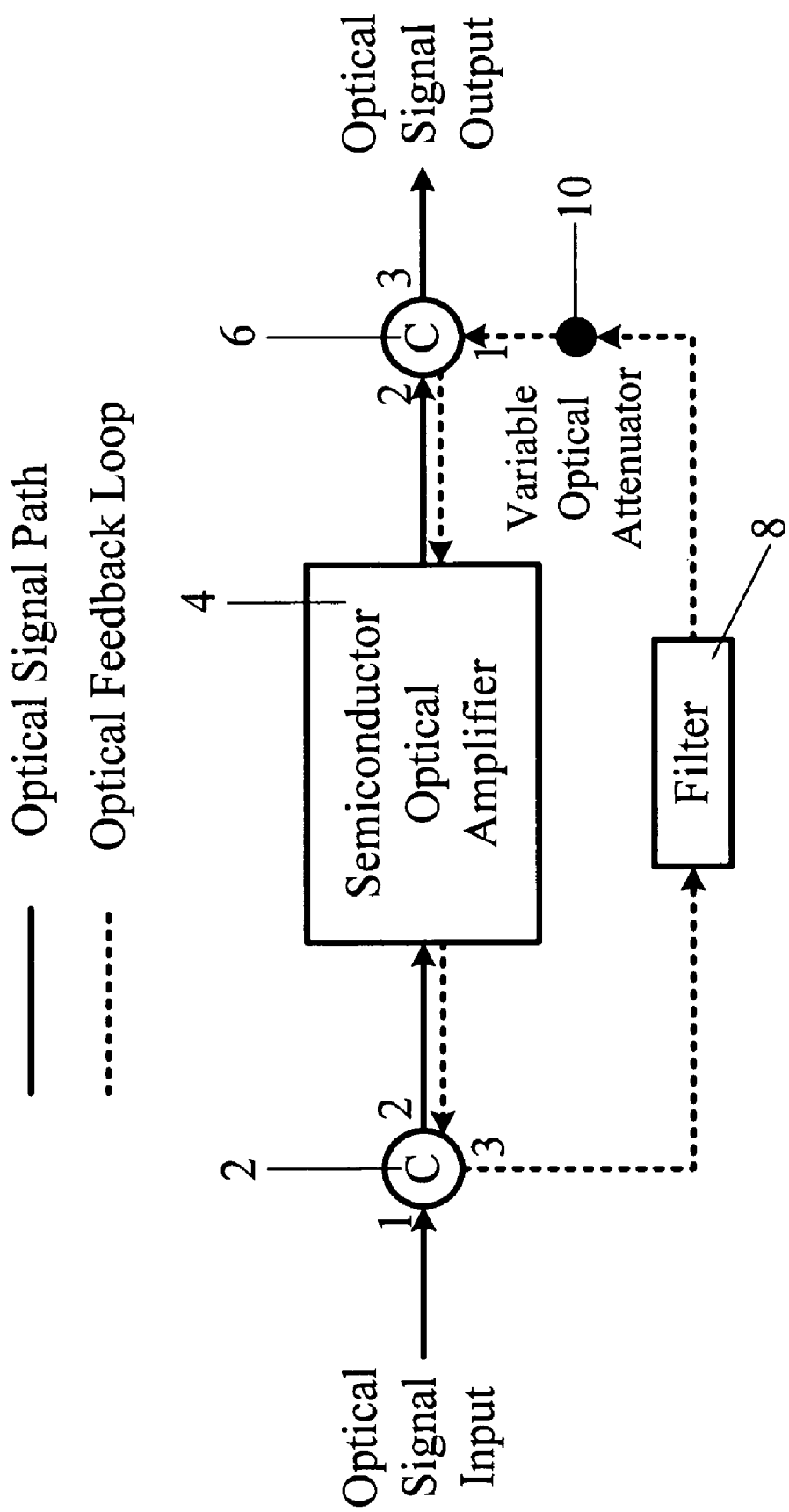
FIG. 2 is a diagram schematically showing the architecture of an adjustable optical signal delay module according to the present invention.

Refer to FIG. 2 for a diagram schematically showing the architecture of an adjustable optical signal delay module according to the present invention. The module of the present invention comprises a SOA 4 and a feedback optical loop. In FIG. 2, the optical signal path is denoted by solid lines, and the feedback optical loop is denoted by dotted lines. In addition to amplifying the received optical signals, the SOA 4 also generates ASE and outputs ASE to the feedback optical loop. The feedback optical loop is coupled to two ends of the SOA 4, receives ASE and then feeds ASE back to the SOA 4 to vary the group refractive index of the SOA 4. Thus an adjustable optical signal delay module can be realized by controlling the power of SOA's ASE. In the embodiment shown in FIG. 2, the feedback optical loop comprises two 3-port optical circulators (one is a front-stage 3-port optical circulator 2, and the other is a rear-stage 3-port optical circulator 6), an optical filter 8, and a variable optical attenuator (VOA) 10. The 3-port optical circulator has three ports as it is named. When a signal is input at Port 1, it is output from Port 2; when a signal is input at Port 2, it is output from Port 3. Thus is formed a unidirectional cyclic transmission. The 3-port optical circulator may be replaced by a multi-port optical circulator or additional optical paths. In the front-stage 3-port optical circulator 2, Port 1 receives optical signals, and Port 2 outputs the optical signals to the SOA 4. In the rear-stage 3-port optical circulator 6, Port 1 receives amplified optical signals, and Port 2 outputs the amplified optical signals. ASE is output from Port 3 of the front-stage 3-port optical circulator 2 and transmitted to the optical filter 8, and the optical filter 8 filters out unnecessary waves. The filtered ASE is transmitted to the variable optical attenuator 10, and the variable optical attenuator 10 adjusts the power of ASE. After adjusting ASE power, the variable optical attenuator 10 outputs the filtered and adjusted ASE signal to Port 1 of the rear-stage 3-port optical circulator 6, and the rear-stage 3-port optical circulator 6 outputs the filtered and adjusted ASE signal from Port 2 to the SOA 4. ASE power can vary the group refractive index of the SOA, and the group refractive index further varies the timing of optical signals. Therefore, adjusting the power of ASE can adjust the delay timing of optical signals. Thus is realized an adjustable optical signal delay module.

Figure 3:
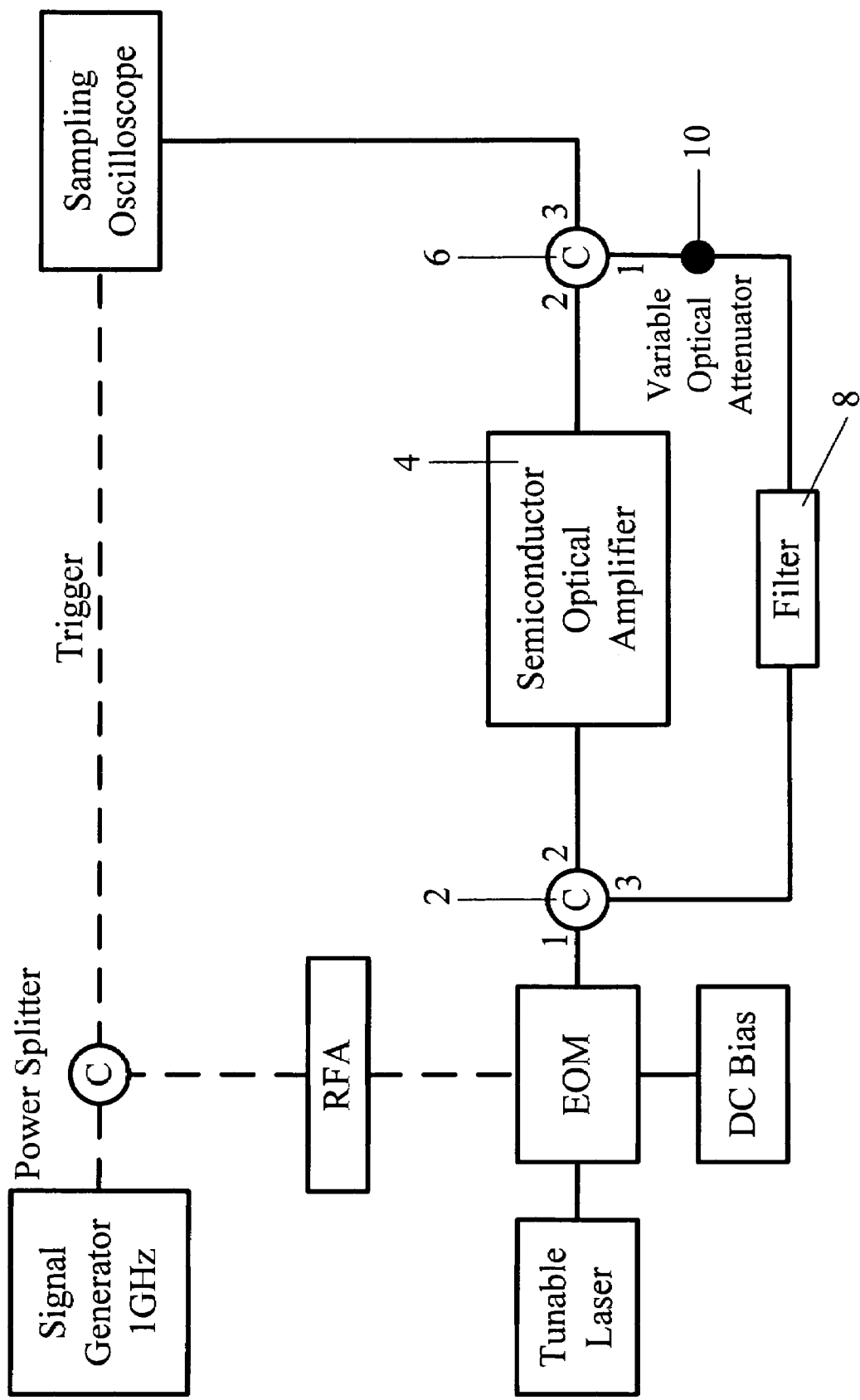
FIG. 3 is a diagram schematically showing the test design of an adjustable optical signal delay module according to the present invention.
Figure 4:
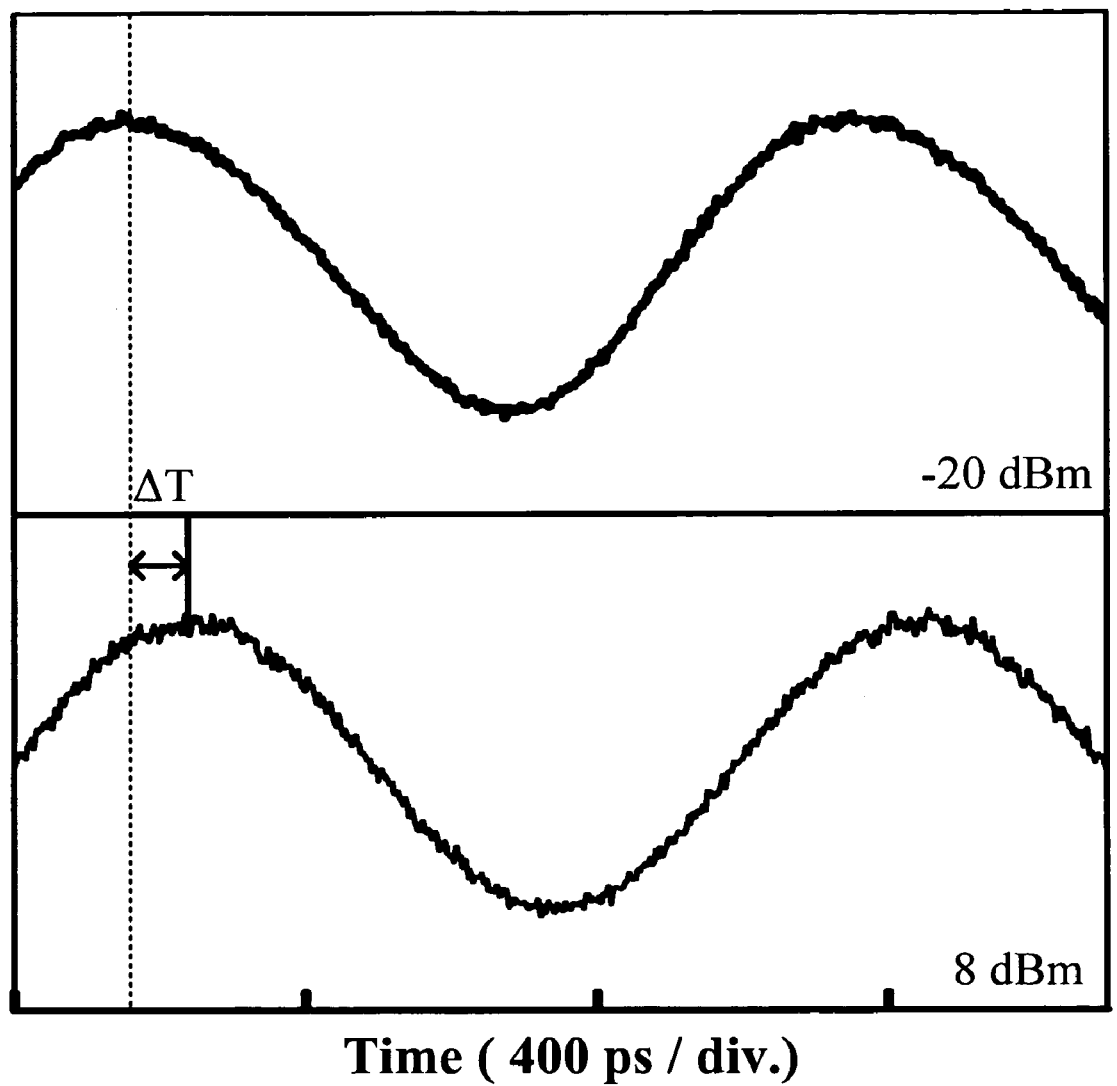
FIG. 4 is a diagram showing the test results.
Figure 5:
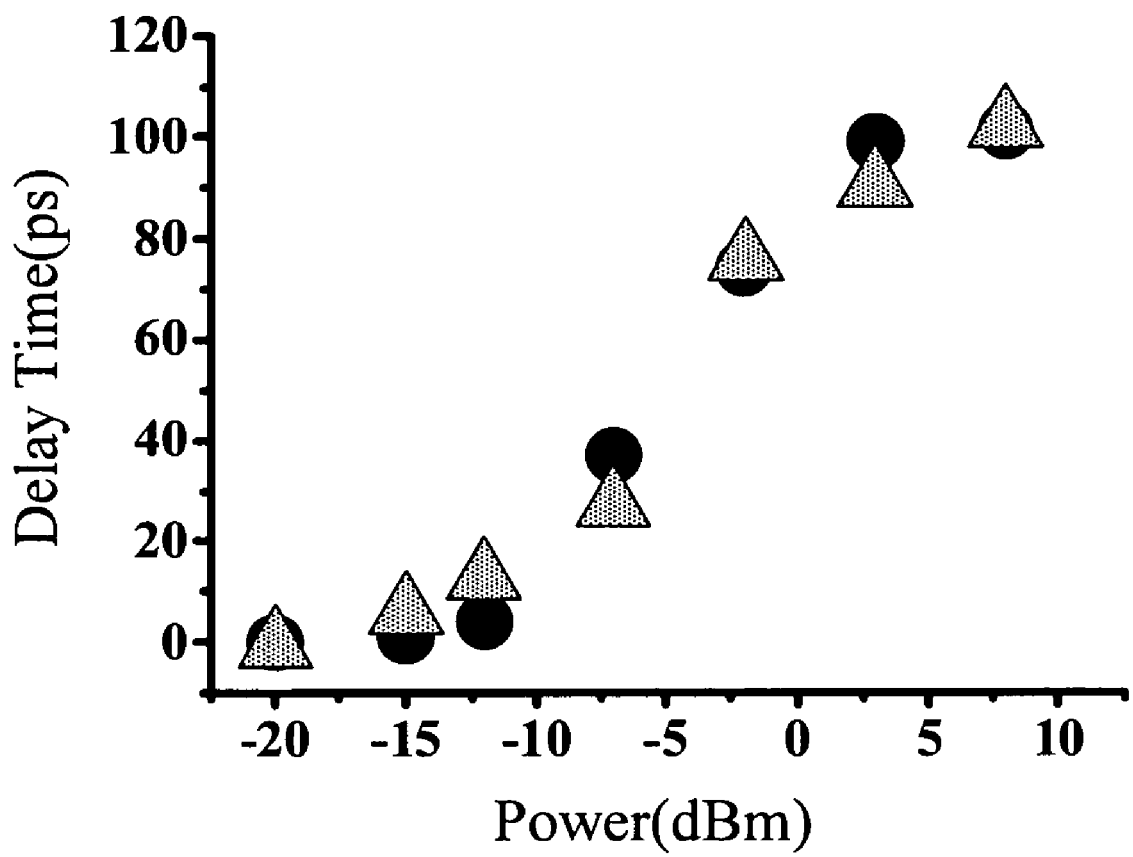
FIG. 5 is a diagram showing the relationships of delay time and power in the conventional method and the present invention.

The present invention uses a variable optical attenuator in an optical feedback system to adjust ASE generated by a SOA and indirectly control optical signal delay. Therefore, the optical feedback system, which comprises optical circulators, an optical filter and an variable optical attenuator, can replace an external optical pump that implements the CPO mechanism in the conventional technology. Refer to FIG. 3 a diagram schematically showing the test design of an adjustable optical signal delay module according to the present invention. In FIG. 3, an Electro-Optic Modulator (EOM) device modulates a tunable laser into a sinusoidal optical signal and inputs the sinusoidal optical signal to Port 1 of a front-stage 3-port optical circulator 2. Next, a SOA 4 receives the optical signal from Port 2 of the front-stage 3-port optical circulator 2 and outputs the optical signal to Port 2 of a rear-stage 3-port optical circulator 6. Then, the rear-stage 3-port optical circulator 6 outputs the optical signal from Port 3 thereof. Further, the optical feedback system feeds ASE generated by the SOA 4 back to the SOA 4. Refer to FIG. 4 to compare signal delay when the variable optical attenuator 10 of the optical feedback system inputs optical powers of −20 dBm (decibel mW) and 8 dBm to the SOA 4. FIG. 4 shows waveforms presented by an oscilloscope and proves that the present invention can indeed achieve optical signal delay via adjusting the optical power input to the SOA. Refer to FIG. 5 a diagram showing the relationship of delay time and power in cases of the conventional method using an external pump laser and the present invention using an optical feedback system. In the test, 1 GHz test signal is input into a semiconductor SOA to compare the signal delays by the conventional method using an external pump laser and the present invention using an optical feedback system. In the test, both the conventional method and the present invention can achieve optical signal delay, which not only proves the practicability of the present invention but also expresses that the present invention can achieve optical signal delay without using an additional pump laser or optical paths. Therefore, the present invention can decrease the fabrication cost of the optical signal delay module and reduce the topology space occupied by the optical signal delay module.

The embodiments described above are only to exemplify the present invention but not to limit the scope of the present invention. Therefore, any equivalent modification or variation according to the shapes, structures, characteristics and spirits discloses in the present invention is to be also included within the scope of the present invention.

What is claimed is:

1. An adjustable optical signal delay module comprising:
   a front-stage 3-port optical circulator receiving an input optical signal at a first port thereof and outputting said input optical signal at a second port thereof;
   a semiconductor optical amplifier receiving said input optical signal from said second port of said front-stage 3-port optical circulator, said semiconductor optical amplifier amplifying said input optical signal into an amplified optical signal, outputting said amplified optical signal, and generating an amplified spontaneous emission, said amplified spontaneous emission being input to said second port of said front-stage 3-port optical circulator and output from a third port thereof;

a rear-stage 3-port optical circulator receiving said amplified optical signal from said semiconductor optical amplifier at a second port thereof and outputting said amplified optical signal at a third port thereof; and a feedback optical loop coupled between said third port of said front-stage 3-port optical circulator and a first port of said rear-stage 3-port optical circulator for coupling at least a portion of said amplified spontaneous emission back to said semiconductor optical amplifier by output from said second port of said rear-stage 3-port optical circulator, said feedback optical loop including (a) an optical filter receiving said amplified spontaneous emission output from said third port of said front-stage 3-port optical circulator and filtering out unnecessary light wavelengths, and (b) a variable optical attenuator receiving said filtered amplified spontaneous emission from said optical filter and outputting said filtered amplified spontaneous emission at an attenuated power level to said first port of said rear-stage 3-port optical circulator to achieve coherent population oscillation to vary a group refractive index of said semiconductor optical amplifier and thereby delay transmission of said input optical signal through said semiconductor optical amplifier.

2. The adjustable optical signal delay module according to claim 1, wherein said feedback optical loop defines as an optical pump required by a coherent population oscillation mechanism.

3. A method for delaying an optical signal comprising:

coupling an optical signal to an input end of a semiconductor optical amplifier to provide an amplified optical signal at an output end thereof;

coupling a feedback optical loop to said input and output ends of said semiconductor optical amplifier;

providing an optical attenuator in said feedback optical loop;

coupling an amplified spontaneous emission generated by said semiconductor optical amplifier and passed through said optical attenuator to said output end of said semiconductor optical amplifier; and adjusting said optical attenuator to adjust a power level of said amplified spontaneous emission to achieve coherent population oscillation to vary a group refractive index of said semiconductor optical amplifier and thereby delay timing transmission of said optical signal through said semiconductor optical amplifier.

4. The method for delaying an optical signal according to claim 3, wherein said feedback optical loop defines as an optical pump required by a coherent population oscillation mechanism.

* * * * *